United States Patent [19]

Susko et al.

[11] Patent Number: 4,885,074
[45] Date of Patent: Dec. 5, 1989

[54] PLASMA REACTOR HAVING SEGMENTED ELECTRODES

[75] Inventors: Robin A. Susko, Owego; James W. Wilson, Vestal, both of N.Y.

[73] Assignee: International Business Machines Corporation, Armonk, N.Y.

[21] Appl. No.: 342,658

[22] Filed: Apr. 26, 1989

Related U.S. Application Data

[63] Continuation of Ser. No. 18,233, Feb. 24, 1987, abandoned.

[51] Int. Cl.[4] .......................................... C23C 14/00
[52] U.S. Cl. .................................................. 204/298
[58] Field of Search .................. 204/298 TS, 298 SC, 204/298 MB, 192.1, 192.12; 156/345

[56] References Cited

U.S. PATENT DOCUMENTS

| 894,240 | 8/1986 | Babu et al. | |
|---|---|---|---|
| 3,757,733 | 9/1973 | Reinberg | 118/49.5 |
| 3,864,239 | 2/1975 | Fletcher et al. | 204/192.12 |
| 3,904,506 | 9/1975 | Carmichael et al. | 204/298 |
| 3,968,018 | 7/1976 | Lane et al. | 204/192 |
| 4,264,393 | 4/1981 | Gorin et al. | 156/345 |
| 4,274,936 | 6/1981 | Love | 204/192 R |
| 4,282,077 | 8/1981 | Reavill | 204/192 E |
| 4,318,767 | 3/1982 | Hijikata et al. | 156/345 |
| 4,361,441 | 11/1982 | Tylko | 75/10 |
| 4,394,162 | 7/1983 | Tylko | 75/10 |
| 4,415,427 | 11/1983 | Hidler et al. | 204/298 TS |
| 4,425,210 | 1/1984 | Fazlin et al. | 204/298 |
| 4,442,338 | 4/1984 | Yamazaki | 219/121 PE |
| 4,474,659 | 10/1984 | Fazlin | 204/192.12 |
| 4,482,419 | 11/1984 | Tsukada et al. | 156/345 |
| 4,559,901 | 12/1985 | Morimoto et al. | 204/192.12 |
| 4,601,806 | 7/1986 | Wirz | 204/298 TS |
| 4,612,077 | 9/1986 | Tracy et al. | 204/298 |
| 4,618,477 | 10/1986 | Babu et al. | 422/186.29 |
| 4,627,904 | 12/1986 | Mintz | 204/192.1 |

OTHER PUBLICATIONS

Thin Film Technology by Robert W. Perry, Peter M. Hall & Murray T. Harris, Van Nostrand Reinhold Company, Copyright 1968.

Primary Examiner—John F. Niebling
Assistant Examiner—Steven P. Marquis
Attorney, Agent, or Firm—David L. Adour; Judith D. Olsen

[57] ABSTRACT

A reactor for generating a uniform field of energized gas for plasma processing. The reactor chamber is capable of sustaining a vacuum. A mechanism for mounting a workpiece is disposed within the reactor chamber so that a workpiece can be exposed to energized gas. A first electrode in the chamber is positioned in operative relationship to the workpiece mounting mechanism and a second electrode within the reactor is positioned to at least partially surround the first electrode.

12 Claims, 3 Drawing Sheets

PLASMA REACTOR HAVING SEGMENTED ELECTRODES

This application is a continuation, of application Ser. No. 07/018,233, filed 2/24/87, now abandoned.

BACKGROUND OF THE INVENTION

Field Of The Invention

The present invention relates to a system for generating a uniform field of energized gas and, more particularly, to a system having segmented electrodes for use in plasma processing.

In the manufacture of many electronic components, such as integrated circuits and semiconductor devices, there is a need to deposit material onto, and etch material from, substrates. In particular, metal such as copper is often deposited and material such as epoxy glass is often removed.

In the field of plasma deposition, an atom may be displaced from the surface of the target connected to a cathode by a process called sputtering or sputter deposition. In this process, the target may be constructed of copper or of another material. The cathode to which the target is attached is subjected to a high voltage in an inert atmosphere such as argon. The inert gas is ionized, forming a plasma from which positive ions escape to bombard the exposed surface of the target and to dislodge by momentum transfer the atoms or clusters of atoms of the target material. It is this dislodging of the target atoms that is known as sputtering. By repeating this process, a number of these primarily neutral atoms move through the space in front of the target, in a relatively high vacuum, until they strike and condense on the surface of a receiver, known as a sample, substrate or workpiece, which is generally in close proximity to the target. A coating of atomic or molecular layers of target material can thus be built up on the substrate. The coating, which is generally less than 10 $\mu$m, is generally sufficient for the metallization of integrated circuits.

The most commonly used plasma reactors have one or more targets oriented such that the surface of the target is parallel to the surface of the sample on which atoms are to be deposited. Atoms emitted from the target tend to be emitted in a non-uniform distribution. In particular, atoms around the edges of the target are not emitted at the same rate as atoms in the center of the target. Accordingly, the deposition of material on the substrate proximate the target is not uniform. Atoms that are ejected from the target perpendicularly and received at the sample surface perpendicularly provide optimum atom deposition thereof. A greater amount of material may be built up in the center of the substrate than at its edges.

Similarly, in etching processes, it has been found that material is etched to a greater extent along the periphery of a substrate than in the interior portions thereof. Substrates used to make printed circuit boards and cards, because they are large, are especially susceptible to non-uniformity of a plasma field, resulting in non-uniform etching, non-uniform deposition and/or non-uniform cleaning of thru holes or viaduct holes (commonly called vias). Vias are paths for electrical interconnections between a first-level conductive pattern and a second- or higher-level conductive pattern. Cleaning of thru holes is referred to as desmearing. In the etching process, for example, a more intense plasma field along the periphery of a workpiece results in a higher etching rate for that portion of the workpiece, whereas a relatively sparse plasma density in the center of the workpiece results in a predictably low etch rate for those sections. It has been found that non-uniformity of an electric field in proximity to a printed circuit board results in non-uniform plasma treatment thereof.

Decreasing the surface area of an electrode results in a more uniform electric field and corresponding plasma field around it. Unfortunately, for larger workpieces such as printed circuit boards and relatively large semiconductor devices, a small electrode is not economically feasible. A series of smaller electrodes, or a segmented electrode, however, in accordance with the present invention can solve the problem of non-uniform plasma field.

U.S. Pat. Nos. 4,361,441 and 4,394,162 issued to Tylko disclose a plasma reactor having spaced stationary electrode structures of which at least one is annular. Between the electrodes an arc is established by a power supply. The arc is pulsated and caused to orbit or circulate around the annular electrode structure to form a conical plasma zone between the electrodes while particulate solids are introduced to the plasma zone. Such apparatus is a possible alternative to industrial processes such as the manufacture of steel, ferro-alloys and cermets. The use of a conical plasma zone, however, is not especially useful for plasma processing of electronic components such as generally planar printed circuit boards and semiconductor devices.

U.S. Pat. No. 4,282,077 issued to Reavill discloses a generally planar electrode plasma reaction chamber, each of a plurality of electrodes being individually connected to a radio frequency (rf) power generator. The electrodes are arranged for defining separate part cells with means for individually and separately adjusting each of the cells.

U.S. co-pending patent application Ser. No. 894,240, filed Aug. 4, 1986 for "Side Source Center Sink Plasma Reactor" assigned to the present assignee, teaches the use of a plurality of planar electrodes in a continuous plasma etching system in which the plasma reactor chamber has provision for continuously introducing a gas and for forcing the gas through one or more thru holes in the substrates in order to remove material therefrom.

It would be advantageous to provide a plasma reactor system for generating uniform plasma fields.

It would further be advantageous to provide a system having two or more independently controlled electrodes for creating a uniform plasma field.

It would further be advantageous to provide a plasma system in which two or more electrodes were movable with respect to a substrate so that the plasma field created by the electrodes could be adjusted and controlled with specificity.

It would further be advantageous to provide a plasma system for uniformly desmearing or etching semiconductor devices.

It would further be advantageous to etch material from relatively large substrates uniformly.

It would further be advantageous to provide a system for depositing material onto a substrate in a uniform manner.

SUMMARY OF THE INVENTION

A reactor for generating a uniform field of energized gas for plasma processing. The reactor chamber is capable of sustaining a vacuum. A mechanism for mounting a workpiece is disposed within the reactor chamber so that a workpiece can be exposed to energized gas. A first electrode in the chamber is positioned in operative relationship to the workpiece mounting mechanism and a second electrode within the reactor is positioned to surround the first electrode at least partially.

BRIEF DESCRIPTION OF THE DRAWINGS

A complete understanding of the present invention may be obtained by reference to the accompanying drawings, when taken in conjunction with the detailed description thereof and in which.

DETAILED DESCRIPTION OF THE PREFERRED EMBODIMENT

Figure 1:
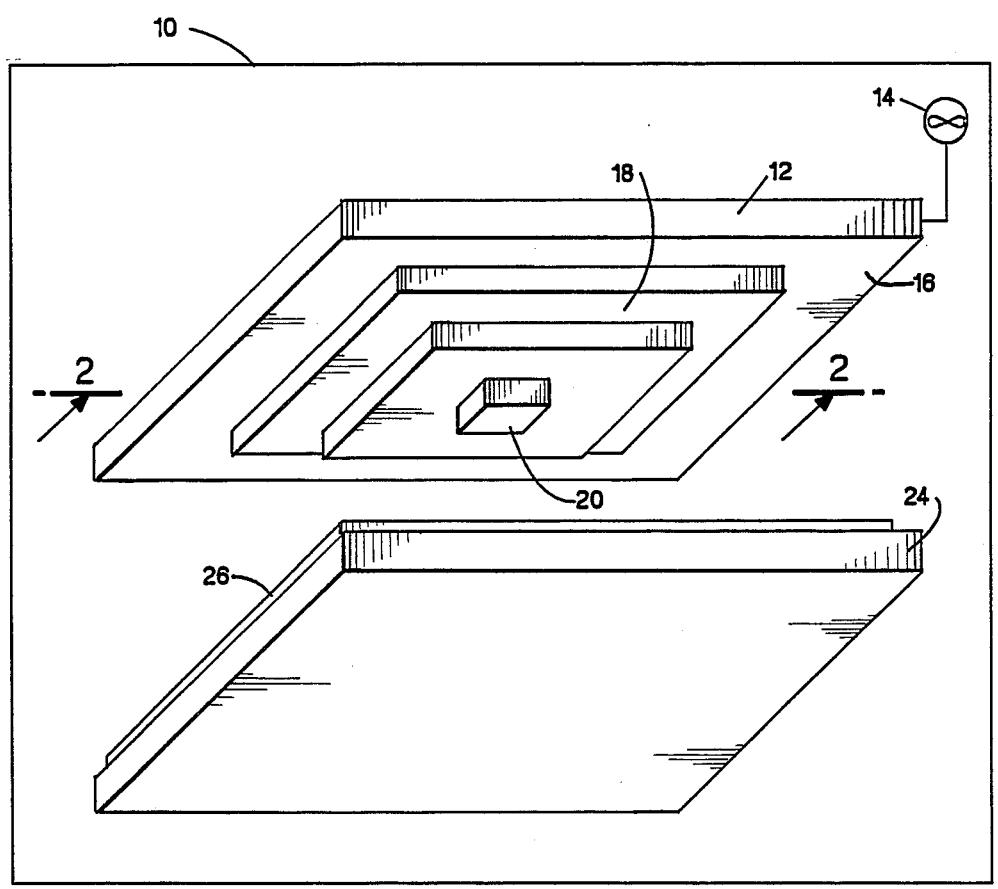
FIG. 1 is an isometric view of a plasma reactor in accordance with the present invention.

Referring now to FIG. 1, there is shown a plasma reactor chamber 10 capable of sustaining a vacuum. Such a chamber is available from Leybold-Heraeus as model number Z-600.

Mounted in the chamber 10 by suitable means, not shown, is an electrode structure 12. The electrode structure 12 has a radio frequency power supply 14 attached thereto. Such a power supply 14 is available from Huttinger, Inc. as model number IS2.5/13560.

The electrode structure 12 has a number of electrode subunits or segments attached to it. The electrode segments are shown as reference numerals 16–20 and are described in greater detail hereinbelow.

Disposed beneath the electrode structure 12 is a platform or sample holder 24. Two electrodes are normally required for sustaining a plasma reaction. One of the electrodes can be either the platform 24 or the vacuum chamber wall 10. The platform 24 is a conventional sample holder or mounting mechanism on which is mounted a workpiece 26. The workpiece 26 can be a printed circuit board, a semiconductor device or any structure to be etched or on which material is to be deposited. The workpiece 26 is electrically grounded in the preferred embodiment, but need not be when a fixed or floating potential is desired.

Figure 2:
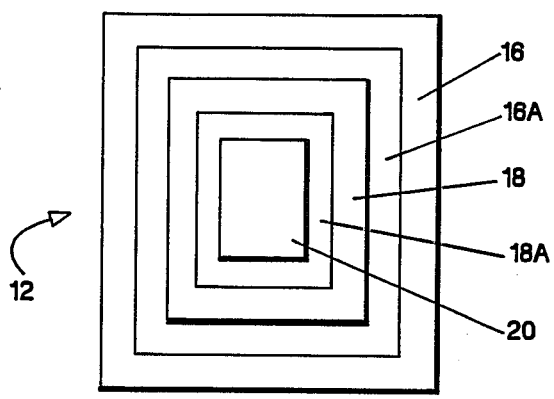
FIG. 2 is a plan view of an electrode taken along section 2—2 of FIG. 1.

Referring now also to FIG. 2, there is shown a view along section lines 2—2 of FIG. 1. The segmented electrode structure is shown at reference numeral 12. An outer electrode 16 in the shape of a rectangle is connected to a first power supply, to shown. A second electrode 18 is disposed within the first electrode 16 and is shaped identically to the first electrode 16, but smaller in both dimensions. A space 16A between the first electrode 16 and the second electrode 18 prevents an unwanted electrical connection or short circuit between the two electrodes 16 and 18 and allows each of them to be energized independently. Any dielectric or electrically non-conductive material, not shown, can fulfill the function of the air gap 16A wherever such gaps are shown in the embodiments hereinbelow depicted. Such material can add stability to the electrode structure and may facilitate the manufacture thereof.

A second power supply, not shown, is attached to the second electrode 18. Such a second power supply can be actuated independently of the first power supply, not shown, to energize the second electrode 18 independently of the first electrode 16.

In a like manner, a third electrode 20 is nested within the second electrode 18 and separated therefrom by a gap 18A to provide electrical insulation therebetween. A third power supply, not shown, is attached to the third electrode 20.

Figure 3:
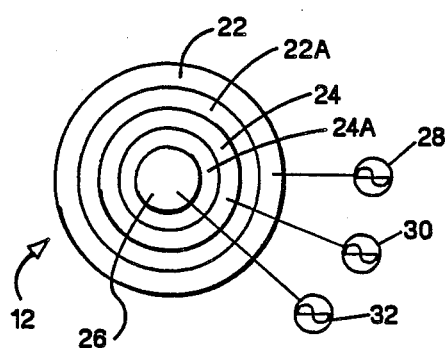
FIG. 3 is a plan view of an alternate embodiment of an electrode in a concentric configuration.

Referring now also to FIG. 3 there is shown a plan view of an alternate embodiment of the electrode structure 12 shown in a concentric configuration. An outer electrode segment 22 forms a circle in which is disposed a smaller circular segment 24 separated by a gap or space 22A. Within the second segment 24 is a third segment 26 separated therefrom by a gap or space 24A. Connected to the outer segment 22 is a first source of power 28. Similarly, a second source of power 30 is connected to the second electrode segment 24 and a third source of power 32 is connected to the central electrode segment 26. Thus, each of the segments 22-26 can be powered independently with respect to one another.

The advantage of using concentric electrode segments, is that circular semiconductor wafers can be processed uniformly and expeditiously. It should be understood that, while a concentric configuration is shown in FIG. 3 and a rectangular configuration in FIGS. 1 and 2, any other polygonal configuration using concentric polygons can be used. For example triangles, hexagons, septagons, octagons, and the like are also contemplated and should be considered to be within the scope of the present invention.

Figure 4:
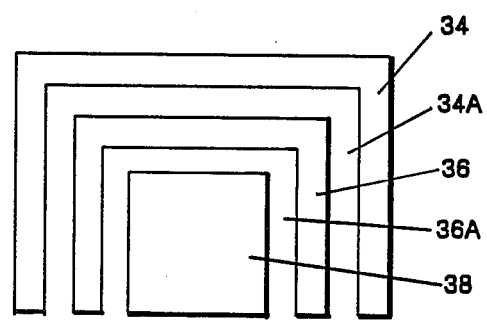
FIG. 4 is a plan view of an alternate embodiment of an electrode having outer segments partially surrounding a central segment.

Referring now also to FIG. 4 there is shown a plan view of an alternate embodiment of an electrode having outer segments partially surrounding a central segment. In particular, the outer electrode segment 34 of this embodiment has three sides. Within the outer electrode 34 is disposed a second electrode segment 36 also having three sides but being smaller in both dimensions. Finally, within the second electrode segment 36 is the central electrode segment 38. Separating the outer electrode 34 and second electrode 36 is a space 34A. Similarly a space 36A separates the second electrode segment 36 from the central segment 38.

In plasma processing prepatterned samples or workpieces, it is often necessary or advantageous to adjust the electrodes in a manner similar to that shown in FIG. 4. This occurs specifically when the workpiece, circuit lines, vias and through-holes or drilled holes are not symmetrical in both X and Y dimensions.

Figure 5:
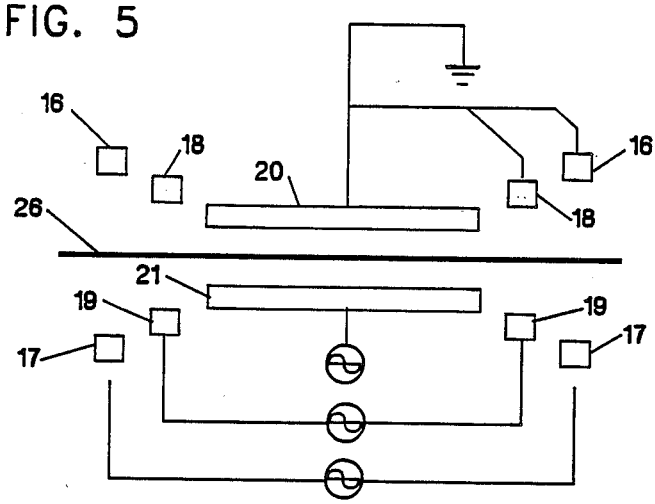
FIG. 5 is a cross-sectional view of the present invention showing electrode segments in ever-increasingly radiating positions relative to one another.

Referring now also to FIG. 5 there is shown an exploded cross-sectional view of the segmented electrode structure 12 shown in FIGS. 1 and 2 in which the electrodes 16–20 are spaced from one another so that no two of them are co-planar. The workpiece 26 is shown without support in this FIGURE for purposes of diagrammatic simplicity. Suitable and conventional mounting mechanisms would normally be used. The electrode segments 16, 18 and 20 are disposed above the workpiece 26. Another set of electrodes 17, 19 and 21 is disposed symmetrically below the workpiece 26, forming a mirror image of the upper electrodes and corresponding to the upper electrode segments. In the preferred embodiment, one set of segments 16, 18, 20 is grounded and one set 17, 19, 21 is powered. In this configuration, both major surfaces of the workpiece 26 can be processed simultaneously.

Separately controlled segments 17, 19 and 21 can be energized at different times to achieve uniformity of etching or deposition. In this way, the central portion, needing greater processing time, could be initiated first and outer portions could be sequentially powered up; or the entire area could be powered up initially and power could be removed from the outer segments sequentially. Other powering up schemes or strategies could be used depending on workpiece patterns and requirements. In the preferred embodiment, in order to etch material from the center of a workpiece 26 to the same extent as the edges thereof are etched, electrode 20 is positioned closest to the workpiece 26. Electrode 18, which surrounds electrode 20, is spaced at a slightly greater distance from the workpiece 26. Similarly, electrode 16 surrounds the central electrodes 18 and 20 and is positioned at a successively greater distance from the workpiece 26.

Figure 6:
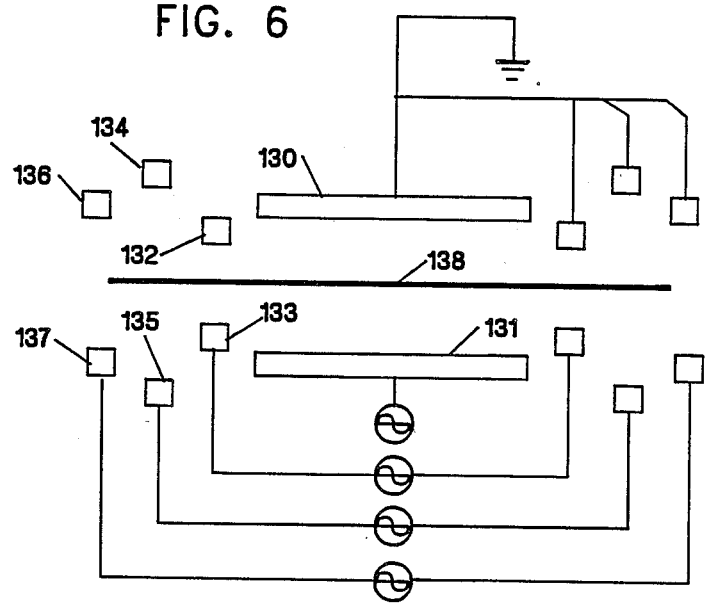
FIG. 6 is a cross-sectional view of electrode segments shown in an alternate spatial relationship with respect to one another.

Referring now also to FIG. 6, there is shown an alternate embodiment of the present invention. Electrode 130 is positioned closest to a workpiece 138. Electrode 132 is placed slightly closer to the workpiece 138. Electrodes 134 and 136 are both placed at greater distances from electrode 130, but not at progressively greater distances from the workpiece 138. All of these electrodes 130, 132, 134 and 136 are grounded. Disposed on the lower side of the workpiece 138 are four powered electrodes 131, 133, 135 and 137.

The powered, lower electrode segments 131–137 are located in a substantially symmetrical panel to the grounded, upper electrode segments 130–136 with respect to the workpiece 138 in this embodiment. It should be understood, however, that symmetry is not necessarily required for operability. In fact, it can be seen that any configuration of electrodes relative to one another and relative to a workpiece can be devised in accordance with the present invention depending upon the purpose for which the reactor chamber is used.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A plasma processor, comprising:
    a reactor chamber capable of sustaining a vacuum;
    a means for mounting a workpiece;
    a first imperforate electrode moveably disposed within the reactor chamber in operative relationship to the means for mounting, and occupying a first plane substantially parallel to the workpiece said first plane located at a first distance from said workpiece;
    a second imperforate electrode moveably disposed within the reactor chamber and at least partially surrounding the perimeter of the first electrode, and occupying a second plane substantially parallel to the workpiece said second plane located at second distance not equal to said first distance; and
    a first and a second means for energizing the first and second electrodes, respectively, to initiate and maintain a plasma region such that the plasma distribution across the workpiece is uniform.

2. The plasma processor of claim 1 wherein the first and second means for energizing the first and second electrodes, respectively operate sequentially.

3. The plasma processor of claim 1 wherein the first and second means for energizing the first and second electrodes, respectively, operate simultaneously.

4. The plasma processor of claim 3 wherein the first and second means for energizing the first and second electrodes, respectively, operate differentially.

5. The plasma processor of claim 1 wherein the first and second electrodes are comprised of material to be deposited on the workpiece.

6. The plasma processor of claim 1 wherein the first and second electrodes are disposed in the same plane.

7. The plasma processor of claim 2 wherein the first and second electrodes are parallel.

8. The plasma processor of claim 1 wherein the first and second electrodes are disposed on opposite sides of the workpiece and one of the two electrodes is electrically grounded.

9. The plasma processor of claim 1 wherein the number of imperforate electrodes in operative relationship with the mounting of the power supplies for energizing them respectively is greater than two.

10. The plasma processor of claim 9 wherein all but the outermost of the electrodes is at least partially and sequentially surrounded by one of the electrodes, and at least two of the electrodes having a spatial relationship with respect to the workpiece wherein the distance between one of the two electrodes and the workpiece is greater than the distance between the other of the two electrodes and the workpiece.

11. The plasma processor of claim 10 wherein the number of electrodes on one side of the workpiece is three, the first electrode has less distance to the workpiece than the second electrode, and the third electrode occupying a third plane is also substantially parallel to the workpiece, at least partially surrounding the second electrode and is spaced further from the workpiece than the second electrode.

12. The plasma processor of claim 10 wherein the second electrode has less distance to the workpiece than the first, said processor further including a third electrode occupying a third plane which at least partially surrounds the second electrode and is also substantially parallel to the workpiece and is spaced at a greater distance from the workpiece than the first and second electrodes, and a fourth electrode occupying a fourth plane at least partially surrounding the third electrode and also substantially parallel to the workpiece and is spaced further from the workpiece than the second electrode but has less distance than the third electrode.

* * * * *